US007209216B2

(12) United States Patent
De Jager et al.

(10) Patent No.: US 7,209,216 B2
(45) Date of Patent: Apr. 24, 2007

(54) LITHOGRAPHIC APPARATUS AND DEVICE MANUFACTURING METHOD UTILIZING DYNAMIC CORRECTION FOR MAGNIFICATION AND POSITION IN MASKLESS LITHOGRAPHY

(75) Inventors: Pieter Willem Herman De Jager, Rotterdam (NL); Theodorus Leonardus Van Den Akker, Valkenswaard (NL); Willem Jurrianus Venema, Eindhoven (NL); Wouter Frans Willem Mulckhuyse, Bussum (NL); Lambertus Gerardus Maria Kessels, Aalst-Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/089,539

(22) Filed: Mar. 25, 2005

(65) Prior Publication Data

US 2006/0215142 A1   Sep. 28, 2006

(51) Int. Cl.
*G03B 27/42* (2006.01)
*G03B 27/54* (2006.01)

(52) U.S. Cl. .......................................... 355/67; 355/53

(58) Field of Classification Search ................ 355/53, 355/67; 250/548; 430/5, 20, 30
See application file for complete search history.

(56) References Cited

U.S. PATENT DOCUMENTS

| 5,229,872 A | 7/1993 | Mumola |
|---|---|---|
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| WO | WO 98/33096 | 7/1998 |
|---|---|---|
| WO | WO 98/38597 | 9/1998 |

*Primary Examiner*—Henry Hung Nguyen
*Assistant Examiner*—Chia-how Michael Liu
(74) *Attorney, Agent, or Firm*—Sterne, Kessler, Goldstein & Fox PLLC

(57) ABSTRACT

A lithographic apparatus in which a size and/or a position of features formed on a substrate are adjusted by adjusting an intensity of radiation at boundaries of pattern features.

14 Claims, 10 Drawing Sheets

46' 46  47  47'

LITHOGRAPHIC APPARATUS AND DEVICE MANUFACTURING METHOD UTILIZING DYNAMIC CORRECTION FOR MAGNIFICATION AND POSITION IN MASKLESS LITHOGRAPHY

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), micro-electro-mechanical-systems (MEMS), and other devices involving fine structures. In a conventional apparatus, a contrast device or a patterning device, which can be referred to as a mask or a reticle, can be used to generate a circuit pattern corresponding to an individual layer of a flat panel display or other device. This pattern can be transferred onto a target portion (e.g., comprising part of one or several dies) on a substrate (e.g., a glass plate). Transfer of the pattern is typically via imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. An advantage of such a system compared to a mask-based system is that the pattern can be changed more quickly and for less cost.

In general, a flat panel display substrate is rectangular in shape. Known lithographic apparatus designed to expose a substrate of this type typically provide an exposure region, which covers a full width of the rectangular substrate, or which covers a portion of the width (e.g., about half of the width). The substrate is scanned underneath the exposure region, while the mask or reticle is synchronously scanned through the beam. In this way, the pattern is transferred to the substrate. If the exposure region covers the full width of the substrate, then exposure is completed with a single scan. If the exposure region covers, for example, half of the width of the substrate, then the substrate is moved transversely after the first scan, and a second scan is performed to expose the remainder of the substrate.

Another way of imaging includes pixel grid imaging, in which a pattern is realized by successive exposure of spots.

When generating a pattern on a substrate it is necessary to ensure that the pattern is accurately overlaid on the substrate. This is especially the case when forming a device that is formed by a plurality of subsequent processes involving lithography. In such cases, it is essential to ensure that the pattern formed in one process is correctly overlaid with the pattern formed in a subsequent process. Otherwise, the device being formed can malfunction.

Similarly, in some processes, more than one pattern exposure can be used to generate the pattern on the substrate. In such cases, it is essential that the pattern generated during the first exposure step is accurately overlaid with the pattern formed in the second exposure step if the overall pattern to be formed is to meet the required tolerances.

Furthermore, some lithographic apparatus employ more than one so-called "light engine" to generate the pattern on the substrate. Such light engines project separate modulated beams of radiation onto the substrate at the same time and the pattern generated on the substrate is the combined exposure of all of the light engines. Accordingly, if the pattern is to be formed within the required image quality tolerances, the patterns generated by each light engine must be accurately aligned with respect to each.

In order to ensure accurate alignment of the patterns generated on a substrate, it is necessary to be able to adjust the position of the modulated radiation beam relative to the substrate (in a plane parallel to the surface of the substrate) and to adjust the magnification of the pattern, for example to compensate for thermal expansion of the substrate. In order to adjust the position of the modulated radiation beam relative to the substrate, actuator systems can move a substrate table that holds the substrate and/or the projection system. It is therefore possible to adjust the position of the substrate table relative to the projection system, and hence the modulated radiation beam.

In order to adjust the magnification of the pattern, the projection system can be provided with variable optical magnification control.

The solutions to the problem of adjusting the position and magnification of the pattern generated on the substrate described above require complex mechanical and/or opto-mechanical systems that increase the cost of the lithographic apparatus, require large amounts of calibration, and are expensive to maintain. Furthermore, such systems are not capable of making adjustments within an exposure field. For example, it is not possible to move one part of a substrate relative to the projection system without moving another part of the substrate relative to the projection system. Likewise, the magnification of a projection system must be adjusted uniformly across its entire exposure field. Accordingly, there is no possibility to take account of local deformations within a substrate.

Therefore, what is needed is a system and method in which adjustment of the magnification and position relative to the substrate of one or more regions of a pattern generated on the substrate is facilitated.

SUMMARY

According to one embodiment of the present invention, there is provided a lithographic apparatus comprising an illumination system, an array of individually controllable elements, and a pattern controller. The illumination system conditions a radiation beam. The array of individually controllable elements modulates the beam. The pattern controller provides control signals to the array of individually controllable elements, such that the radiation beam is modulated to generate a desired pattern on the substrate. The pattern controller includes a pattern adjuster that adjusts at least one of a size and a position, relative to the substrate, of at least a part of the pattern generated on the substrate by adjusting radiation intensity of at least a part of the modulated beam.

According to one embodiment of the present invention, there is provided a device manufacturing method comprising the following steps. Projecting a beam of radiation onto a substrate that has been modulated by an array of individually controllable elements. Providing control signals to the array of individually controllable elements, such that the radiation beam is modulated to generate a desired pattern on the substrate. At least one of a size and a position, relative to the substrate, of at least a part of the pattern generated on the substrate is adjusted by adjusting the intensity of at least a part of the modulated radiation beam.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the one or more embodiments of the present invention and to enable a person skilled in the pertinent art to make and use the one or more embodiments of the present invention.

The present invention will now be described with reference to the accompanying drawings. In the drawings, like reference numbers can indicate identical or functionally similar elements.

DETAILED DESCRIPTION

Figure 1:
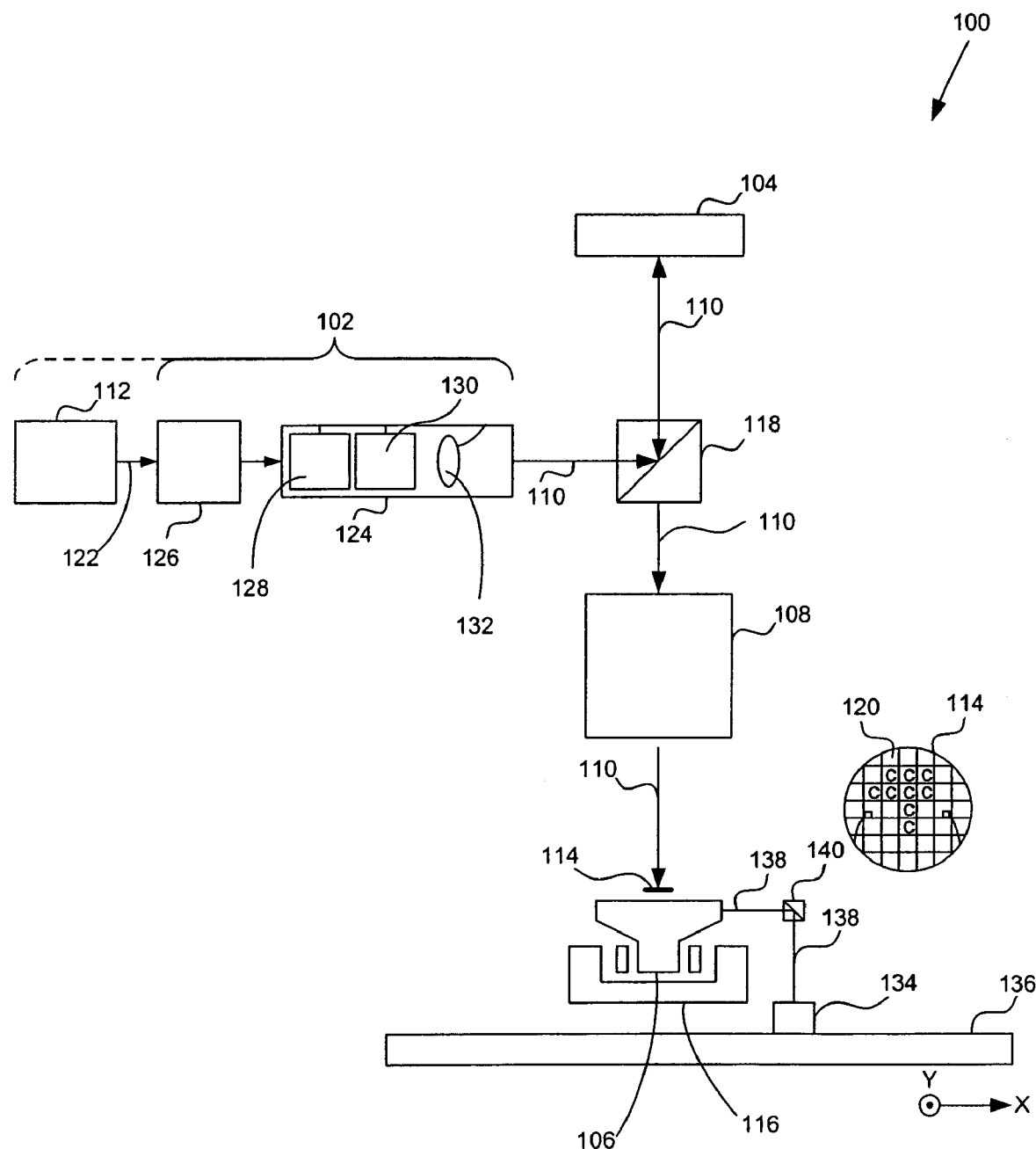
FIG. 1 depicts a lithographic apparatus, according to one embodiment of the present invention.

In one embodiment of the present invention provides a blazing portion in a section of an array of individually controllable elements (e.g., a contrast device). All the elements in the blazing portion have their individually controllable elements positioned at a same angle, which forms the blazing portion. In one example, this can be accomplished through use of a super-pixel. The blazing portion is used to increase light intensity in a first diffraction order a beam modulated by the array. This is accomplished by substantially eliminating a negative first diffraction order modulated beam, such that the positive first diffraction order modulated beam has, in effect, about equal to or more than twice the intensity compared to a typical positive first diffraction order modulated beam. For example, when using a $\lambda/4$ tip deflection, substantially all of the incident light is reflected in the first diffraction order.

In another embodiment, instead of a first diffraction order, a higher diffraction order can be used by higher tip deflection. For instance, all the light is concentrated in the second diffraction order for $\lambda/2$ tip deflection. It is to be appreciated that all the light is concentrated in the n-th diffraction order upon n times $\lambda/4$ tip deflection.

In another embodiment, perpendicular projection is accomplished by directing light onto the array at a diffraction order of interest (which is used within the projection part), where the light can also impinge on a blazing portion of the array, such that the projected light leaves the contrast device perpendicular.

Thus, in one example, through use of a blazing portion it is possible to concentrate substantially all of the diffracted energy in the order of interest (e.g., a diffraction order) towards a substrate.

In another embodiment, "partial coherent imaging" mode can be used, during which the array of individually controllable elements is imaged at the substrate, however no super-pixels are used.

Overview and Terminology

The use of "object," "substrate," "work piece," or the like are interchangeable in this application, and can be, but are not limited to, a work piece, a substrate (e.g., a flat panel display glass substrate), a wafer (e.g., a semiconductor wafer for integrated circuit manufacture), a print head, micro or nano-fluidic devices, a display panel in a projection display system, or the like.

The terms "contrast device," "patterning device," "patterning array," or "array of individually controllable elements" used herein should be broadly interpreted as referring to any device that can be used to modulate the cross-section of a radiation beam such as to create a pattern in a target portion of a substrate (e.g., object). It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit. The terms "light valve" and "Spatial Light Modulator" (SLM) can also be used in this context. Examples of such patterning devices include:

A programmable mirror array. This can comprise a matrix-addressable surface having a viscoelastic (e.g., having viscous as well as elastic properties) control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the addressable surface.

It will be appreciated that, as an alternative, the filter can filter out the diffracted light, leaving the undiffracted light to reach the substrate.

An array of diffractive optical MEMS devices (Micro Electro-Mechanical Systems) can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. Mirror arrays are described in, for example, U.S. Pat. Nos. 5,296,891 and 5,523,193, and PCT patent applications WO 98/38597 and WO 98/33096, which are incorporated herein by reference in their entireties.

The lithographic apparatus can comprise one or more patterning arrays. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements and a common projection system (or part of the projection system).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements, such as a micro lens array (known as an MLA) or a Fresnel lens array, e.g., to form the secondary sources and to image spots onto the substrate. In such an arrangement, each of the focusing elements in the array of focusing elements can be associated with one of the individually controllable elements in the array of individually controllable elements. Alternatively, the projection system can be configured such that radiation from a plurality of the individually controllable elements in the array of individually controllable elements is directed to one of the focusing elements in the array of focusing elements and from there onto the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein can be considered as within the scope of the more general terms "substrate" or "target portion," respectively. The substrate referred to herein can be processed, before or after exposure, in for example a track (a tool that typically applies a layer of resist to a substrate and develops the exposed resist), a metrology tool and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

In another example, the invention can take the form of a computer program containing one or more sequences of machine-readable instructions describing a method as disclosed above, or a data storage medium (e.g., semiconductor memory, magnetic or optical disk) having such a computer program stored therein.

Exemplary Environment

FIG. 1 schematically depicts a lithographic projection apparatus 100, according to one embodiment of the present invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation, 248 nm, 193 nm, 157 nm, EUV radiation, e.g., 10–13 nm, etc.), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or $CaF_2$ lens system or a catadioptric system comprising lens elements made from such materials or a mirror system) can be used for projecting the patterned beam received from a directing device 118 (e.g., a beam splitter).

Light is directed from directing device 118 onto a target portion 120 (e.g., one or more dies) of substrate 114. Projection system 108 can project an image of the array of individually controllable elements 104 onto substrate 114.

The illumination 124 can comprise an adjusting device 128 for setting the outer and/or inner radial extent (commonly referred to as (σ-outer and σ-inner, respectively) of the intensity distribution in beam 122. In addition, illuminator 124 will generally include various other components. In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using directing device 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

In these first four exemplary modes, "partial coherent imaging" is typically performed for integrated circuit formation. Using this imaging, each element in an array of individually controllable elements has a unique tilt. The array is positioned at the object plane and the substrate is positioned at the image plane of the imaging projection optics. Various illumination modes can be applied: annular, conventional, quadrupole, dipole etc. Also, different configurations for each element in an array of individually controllable elements can be used to increase the "negative black" values: phase step mirrors, applying larger tilts, shaping the mirrors (butterfly, H-shape), or the like.

Combinations and/or variations on the above described modes of use or entirely different modes of use can also be employed.

Figure 2:
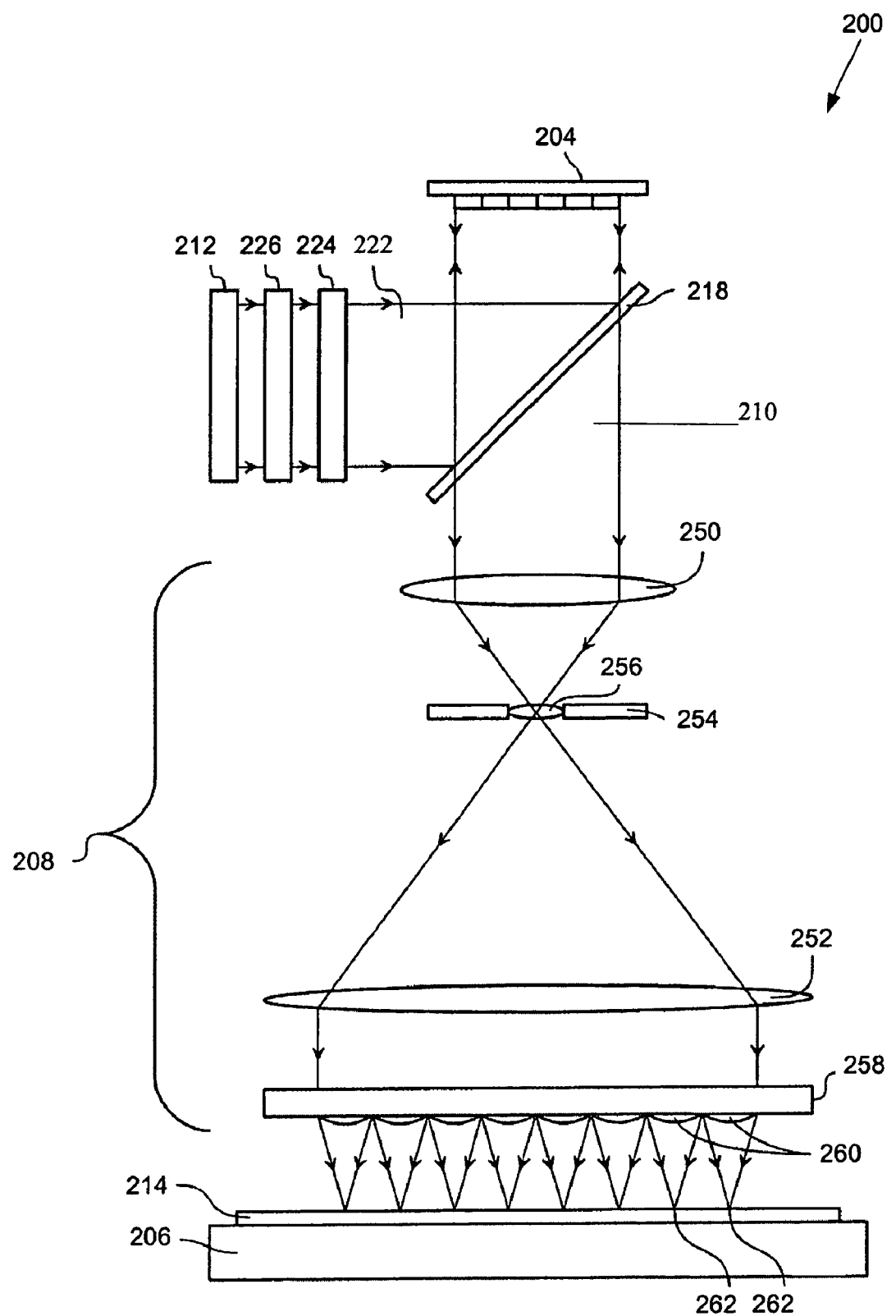
FIG. 2 depicts a lithographic apparatus that can be used, for example, in the manufacture of a flat panel display, according to one embodiment of the present invention.

FIG. 2 depicts a lithographic apparatus 200, according to one embodiment of the present invention. For example, apparatus 200 can be especially useful in the manufacture of flat panel displays using a pixel grid imaging mode, discussed below.

Projection system 208 can project images of secondary sources for which the elements of the array of individually controllable elements 204 act as shutters.

In an imaging grid array embodiment, projection system 208 can also comprise a micro lens array (MLA) to form the secondary sources and to project microspots onto substrate 214.

Source 212 (e.g., a frequency tripled Nd:YAG laser in pixel grid imaging mode or an excimer laser in other modes) can produce a beam of radiation 222. Beam 222 is fed into an illumination system (e.g., illuminator) 224, either directly or after having traversed conditioning device 226, such as a beam expander, for example.

In one example, when apparatus 200 is operating in a pixel grid imaging mode, discussed below, illuminator 224 can comprise an adjusting device for setting a zoom to adjust a spot size of beam 222. In addition, illuminator 224 will generally include various other components, such as spot generator and a condenser. For example, spot generator can be, but is not limited to, a refractive or diffractive grating, segmented mirrors arrays, waveguides, or the like. In this way, beam 210 impinging on the array of individually controllable elements 204 has a desired zoom, spot size, uniformity, and intensity distribution in its cross section.

As shown in FIG. 2, projection system 208 includes a beam expander, which comprises two lenses 250 and 252. First lens 250 is arranged to receive a modulated radiation beam 210 and focus it through an aperture in an aperture stop 254. In one example, a lens 256 is located in the aperture. Radiation beam 210 then diverges and is focused by second lens 252 (e.g., a field lens).

Projection system 208 further comprises an array of lenses 258 (e.g., a microlens array (MLA)) arranged to receive expanded modulated radiation 210. Different portions of the modulated radiation beam 210, corresponding to one or more of the individually controllable elements in a patterning or contrast device 204, pass through respective lenses 260 in MLA 258. Each lens 260 focuses the respective portion of the modulated radiation beam 210 to a point which lies on a substrate 214. In this way, an array of radiation spots 262 are exposed onto substrate 214. Although only eight lenses 260 are shown, MLA 258 can comprise many thousands of lenses, which is also true of a number of individually controllable elements in the array of individually controllable elements used as patterning or contrast device 204.

The system in FIG. 2 allows for another mode of operation, Pixel Grid Imaging Mode. In this mode the pattern formed on substrate 214 is realized by subsequent exposure of spots formed by spot generator 130 that are directed onto array 204. The exposed spots have substantially the same shape. On substrate 214 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

In one example, using this mode, which is typically used for formation of flat panel displays, individually controllable elements can be grouped into super-pixels. One super-pixel modulates the light of one spot at the substrate. The super-pixel is imaged at the entrance of an MLA in the exit pupil of each spot printed. The spot shape can be influenced by the illuminator through use of spot defining element (e.g., spot generators), zoom of blazing functions, or the like.

Figure 3:
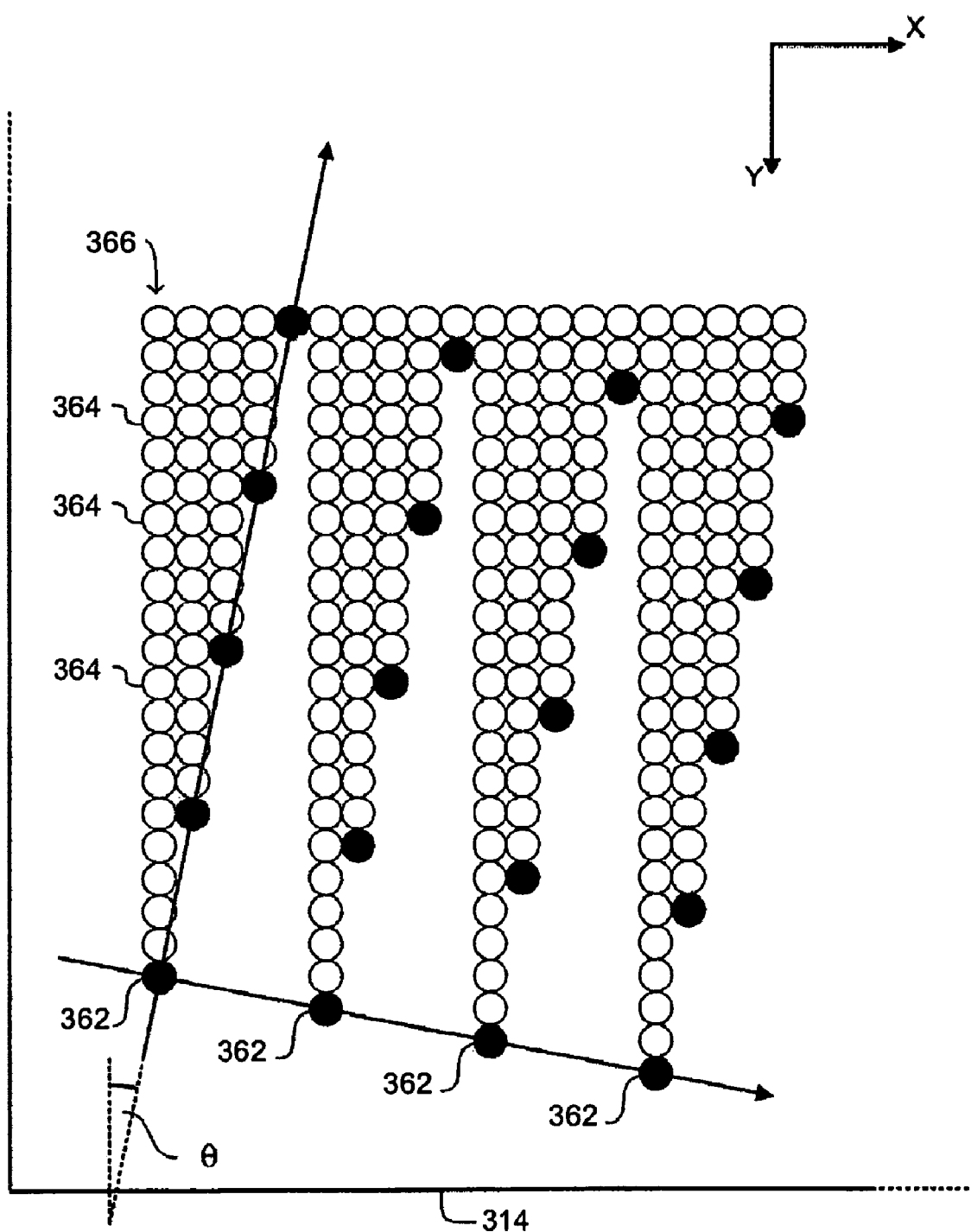
FIG. 3 depicts a mode of transferring a pattern to a substrate using a lithographic apparatus, according to one embodiment of the present invention.

FIG. 3 illustrates schematically how a pattern on a substrate 314 is generated, according to one embodiment of the present invention. For example, this embodiment can be performed using the pixel grid imaging mode discussed above.

The darkened circles 362 represent spots recently projected onto substrate 314 by a MLA in a projection system, for example the projection system as shown in FIG. 2. Substrate 314 is moved relative to the projection system in a Y direction as a series of exposures are exposed on substrate 314.

The open circles 364 represent spots that have previously been exposed on substrate 314. As shown, each spot 362 projected onto substrate 314 using the array of lenses within the projection system exposes a row 366 of spot exposures 362/364 on substrate 314. The complete pattern for substrate 314 is generated by the sum of all the rows 366 of spot exposures 364 exposed by each of the spots 362. Such an arrangement is commonly referred to as "pixel grid imaging," which was discussed above.

It can be seen that the array of radiation spots 362 is arranged at an angle θ relative to substrate 314 (i.e., when the edges of the substrate 314 lie parallel to the X and Y directions). This is done so that when substrate 314 is moved in a scanning direction (e.g., the Y-direction), each radiation spot 362 will pass over a different area of substrate 314, thereby allowing the entire substrate to be covered by the array of radiation spots. It will be appreciated that for ease of illustration the angle θ is exaggerated in FIG. 3.

It is to be appreciated that although 5×5 spots are shown in between two neighboring spots of the MLA, in one example up to about 100×100 spots can be used.

In one example, a spot grid at a substrate is about half a minimum linewidth to be printed (e.g., from about 0.1 microns up to a few microns), while a spot pitch at a MLA is about 100 micrometers up to about a few hundred micrometers.

Figure 4:
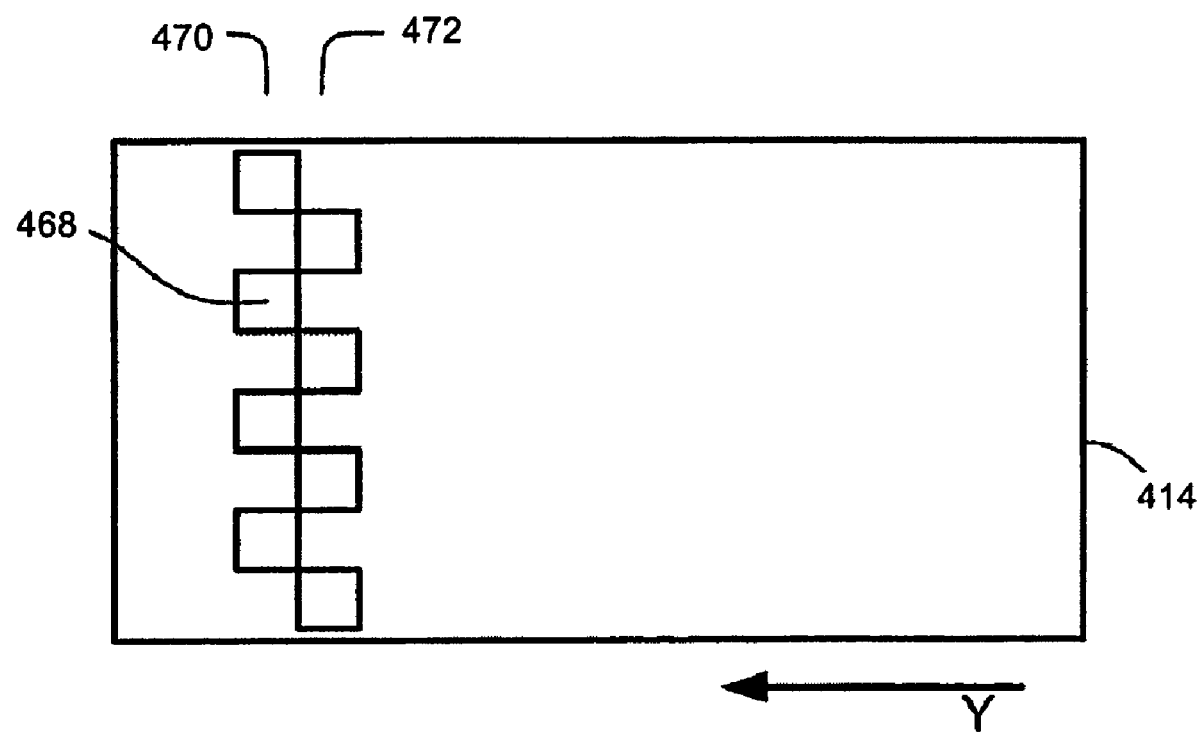
FIG. 4 depicts an arrangement of optical engines for exposing a pattern on a substrate, for example, used to manufacture a flat panel display, according to one embodiment of the present invention.

FIG. 4 shows schematically how an entire flat panel display substrate 414 is exposed in a single scan through use of a plurality of optical engines, according to one embodiment of the present invention. Eight arrays 468 of radiation spots are produced by eight optical engines (not shown), arranged in two rows 470, 472 in a "chess board" configuration, such that the edge of one array of radiation spots slightly overlaps (e.g., in the scanning direction Y) with the edge of the adjacent array of radiation spots. In this example, a band of radiation extends across a width of substrate 414, allowing exposure of the entire substrate to be performed in a single scan. It will be appreciated that any suitable number of optical engines can be used.

In one example, each optical engine can comprise a separate illumination system, patterning device, and/or projection system, as described above. It is to be appreciated, however, that two or more optical engines can share at least a part of one or more of the illumination system, patterning device, and projection system.

Each optical engine can comprise a separate illumination system IL, patterning device PD and projection system PS as described above. It is to be appreciated, however, that two or more optical engines can share at least a part of one or more of the illumination system, patterning device and projection system.

In order to manufacture a product using a lithographic process, a resist is uniformly applied to the surface of a substrate. A pattern of radiation is then exposed on the resist such that some regions on the resist receive relatively high doses of radiation while other regions of the resist receive relative low doses of radiation. The resist above a given radiation dose threshold reacts and its stability is changed. After the exposure process, the substrate is subjected to further processing operations, which remove the resist that has not reacted. Accordingly, the resist remains on the substrate in the regions that received a radiation dose above the given threshold but is removed from the regions that received a radiation dose below the threshold, exposing the substrate. Accordingly, the resist remains on the substrate in the regions receiving relatively high radiation doses and is removed from the regions on the substrate receiving a relatively low radiation dose. Therefore, by applying an appropriate pattern to the radiation beam exposing the substrate, it is possible to generate a substrate with a required pattern of regions of exposed substrate and regions covered by the resist. Subsequent processing steps are then performed to form part of the device required on the substrate. For example, if a metal layer is applied to the substrate before the resist, the metal layer that is not protected by the patterned resist layer can be etched away. Accordingly, once the resist is removed, the substrate is left with a metal layer patterned according to the resist pattern, namely according to the pattern of the radiation beam.

It will be appreciated that a lithographic system such as the present invention is not limited to the example described above. For example so-called 'negative resists' can be used. When negative resist is used, radiation exposure of the resist makes it less stable. Accordingly, it is the resist that receives a radiation dose above a given level that is removed in the post-exposure processing. Accordingly, the pattern of resist remaining on the substrate corresponds to the regions on the substrate that receives a radiation dose below a given threshold. Similarly, the pattern of resist on the substrate can be used for a variety of purposes. For example, the exposed regions of the substrate (i.e., those not protected by a layer of resist) can be subjected to processing steps such as ion implantation.

Figure 5A:
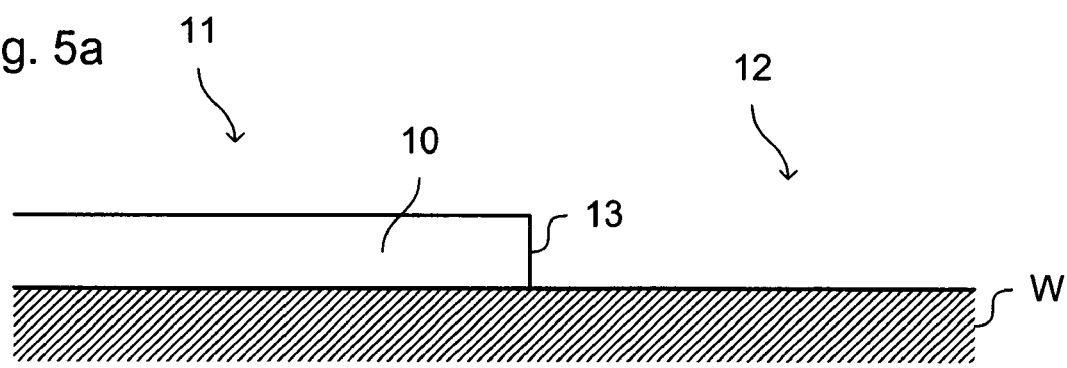
FIGS. 5a, 5b and 5c depict various aspects of a formation of a pattern feature on a substrate, according to one embodiment of the present invention.
Figure 5B:
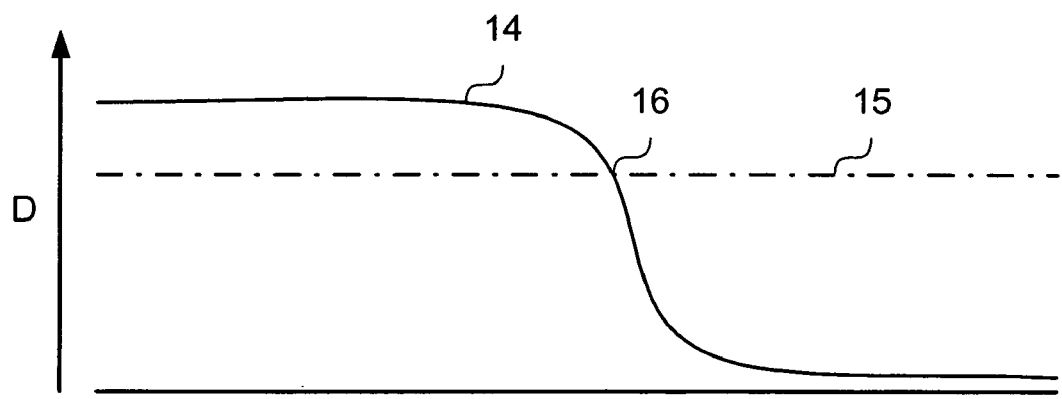
Figure 5C:
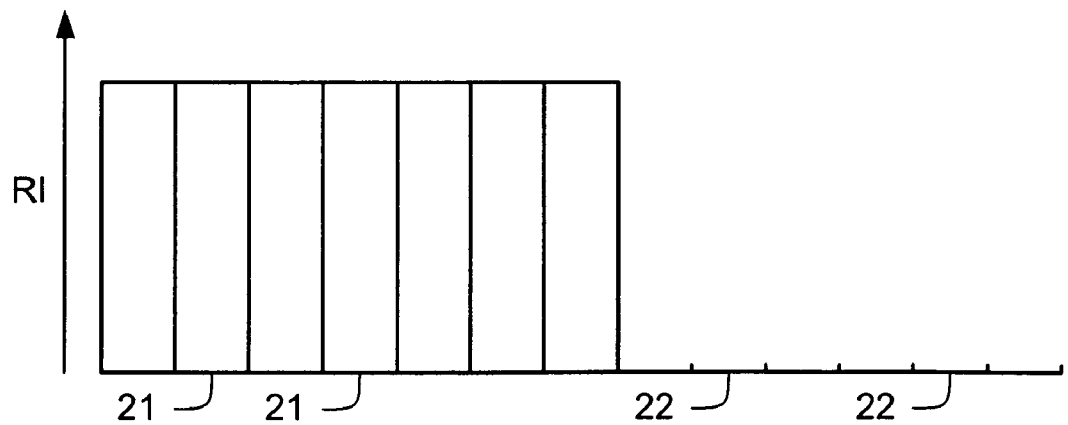

FIGS. 5a, 5b and 5c depict various aspects of a formation of a pattern feature on a substrate, according to one embodiment of the present invention.

FIG. 5a depicts a simple resist pattern that can be desired on a substrate W after the substrate has been exposed with a patterned beam of radiation and processed as discussed above. As shown, a layer of resist 10 covers a first region 11 of substrate W. In a second region 12 of the substrate W, the substrate W is not covered with a layer of resist. As shown, the layer of resist 10 terminates at a boundary 13 between the first region 11 and the second region 12 on the substrate W.

FIG. 5b depicts a plot 14 of the radiation dose D across the substrate W that can be used to generate the resist pattern shown in FIG. 5a. As shown, in the first region 11 of the substrate W, the radiation dose is above a required threshold 15. In the second region 12 of the substrate W, the radiation dose received is below the threshold 15. The boundary 13 between the region in which the resist 10 remains on the substrate W corresponds to the point 16 at which the radiation dose plot crosses the threshold dose 15.

In one example, in order to generate the required radiation dose profile shown in FIG. 5b, the intensity of the radiation beam exposed on the substrate is modulated. For example, the radiation is modulated with an array of individually controllable elements 104 or 204 as discussed above. Each individually controllable element is used to control the intensity of the radiation projected onto a corresponding portion of the substrate.

FIG. 5c depicts the radiation intensities that a plurality of individually controllable elements 21, 22 are set to generate in order to provide the dose profile shown in FIG. 5b. As shown, the individually controllable elements 21 controlling the radiation directed towards the first region 11 of the substrate W are set to have a relatively high radiation intensity RI. The individually controllable elements 22 associated with the second region 12 of the substrate are set to provide a relatively low radiation intensity RI. This generates the dose profile 14 shown in FIG. 5b. It will be appreciated that the roll-off shown in FIG. 5b can be caused by diffraction effects.

In one example, the individually controllable elements used to set the radiation intensity of the exposure of adjacent portions of the substrate can themselves be adjacent and the exposures can take place at the same time. In another example, as described above, lithographic apparatus can employ a pixel grid imaging technique. In this case, the adjacent regions on a substrate corresponding to exposures controlled by a single individually controllable element can be exposed at different times. Similarly, the individually controllable elements that are used to control the radiation intensity of adjacent regions on the substrate can be arranged at entirely separate locations on the array of individually controllable elements.

In yet another example, adjacent points on the substrate, corresponding to exposures controlled by single individually controllable elements, can be exposed by radiation controlled by just one individually controllable element. For example, the adjacent points can be exposed in a succession of exposures. It should also be realized that the radiation dose received at a given point on the substrate can result from the combination of more than one exposure. For example, control of the radiation dose received can be affected by controlling the intensity of one or more of these exposures.

Figure 6A:
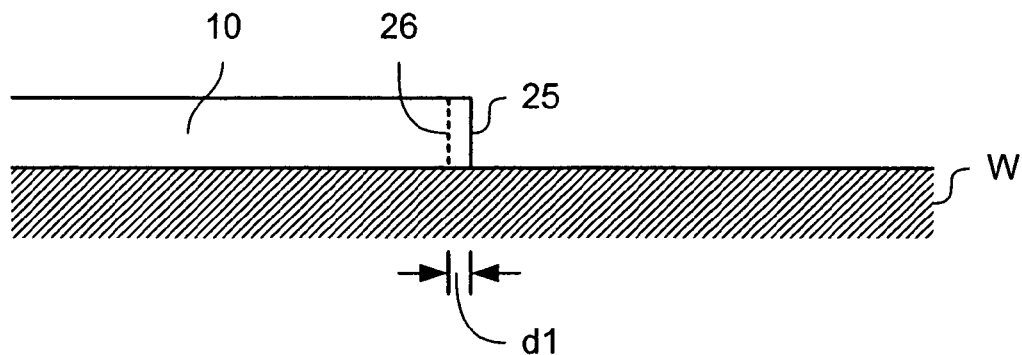
FIGS. 6a, 6b and 6c depict various aspects of an adjustment of a position of a boundary of a pattern feature formed on a substrate, according to one embodiment of the present invention.
Figure 6B:
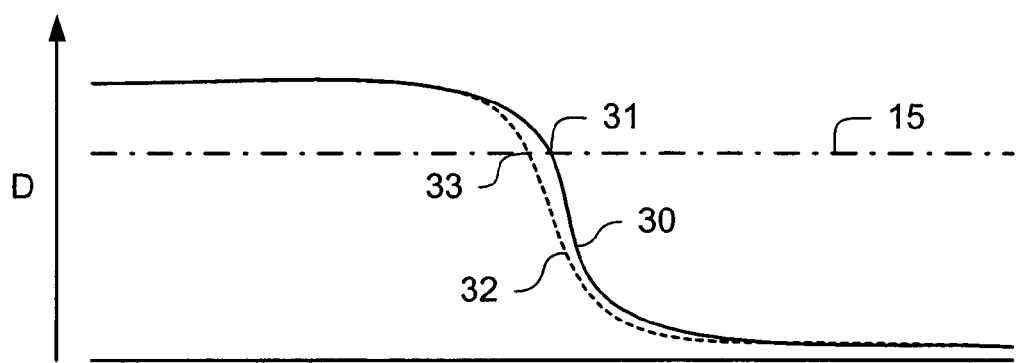
Figure 6C:
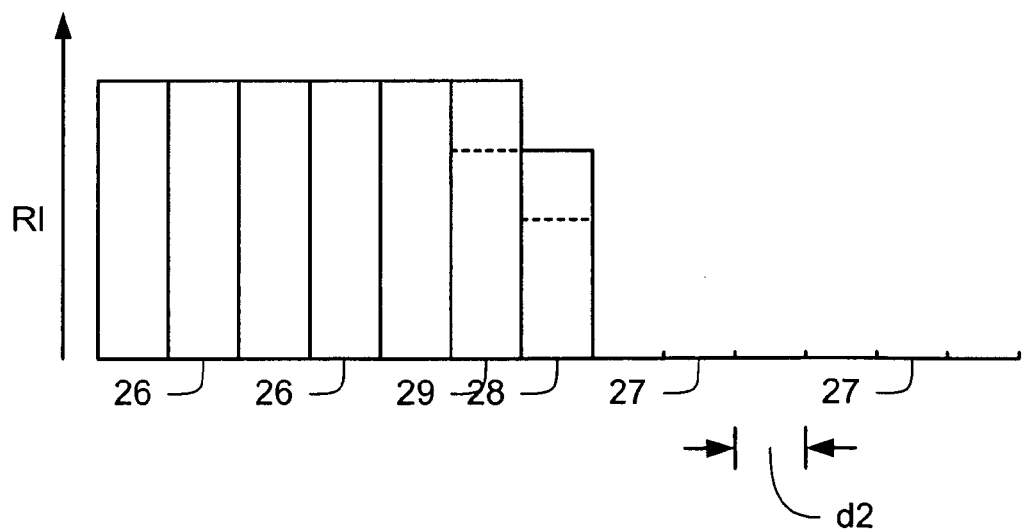

FIGS. 6a, 6b and 6c depict various aspects of an adjustment of a position of a boundary of a pattern feature formed on a substrate, according to one embodiment of the present invention. FIGS. 6a, 6b and 6c depict how the position of the boundary of a feature on the substrate W can be controlled. The solid lines depict a first situation which results in the resist feature 10 having its boundary at a first position 25. The broken lines show a second situation in which the boundary of the resist feature is at a second location 26. As shown, a separation d1 between the first boundary position 25 and the second boundary position 26 is smaller than a size d2 of the regions on the substrate in which the intensity of the radiation is controlled by a single individually controllable element (e.g., the pitch of the spots exposed on the substrate). Accordingly, in this embodiment, it is possible to control the position of the boundary of a feature of the resist 10 with greater precision than is possible by simply defining the pattern on a grid having the same pitch as the array of spots exposed on the substrate.

As shown in FIG. 6c, in one example, a first group of points 26 on the substrate, corresponding to exposures controlled by single individually controllable elements, are set to a relatively high radiation intensity. A second group of points 27 on the substrate, corresponding to exposures controlled by single individually controllable elements, are set to a relatively low radiation intensity. In between the first and second group of points 26,27, a point 28 corresponding to an exposure controlled by a single individually controllable element, is set to an intermediate radiation intensity. As a result of the radiation intensity settings shown in FIG. 6c, a radiation of dose profile 30 is exposed on the substrate, as shown as FIG. 6b. As shown, the radiation dose profile 30 crosses the resist threshold 15 at a point 31, defining the position of the feature boundary 25.

In another example shown in FIG. 6c, the intensity setting of the point 28 on the substrate, corresponding to an exposure controlled by a single individually controllable element, is reduced compared to the first situation. Similarly, the intensity setting for an adjacent point on the substrate, corresponding to an adjacent exposure controlled by a single individually controllable element, is also set to a lower radiation intensity RI than in the first situation. Consequently the radiation dose profile 32 shown in FIG. 6b is generated. As shown in FIG. 6b, the point 33 at which the radiation dose profile crosses the resist threshold 15 is slightly shifted compared to the radiation dose profile 30 of the first situation. Accordingly, the boundary 26 of the feature of the resist 10 is also slightly shifted, resulting in the relatively small movement d1 of the feature boundary.

Figure 7A:
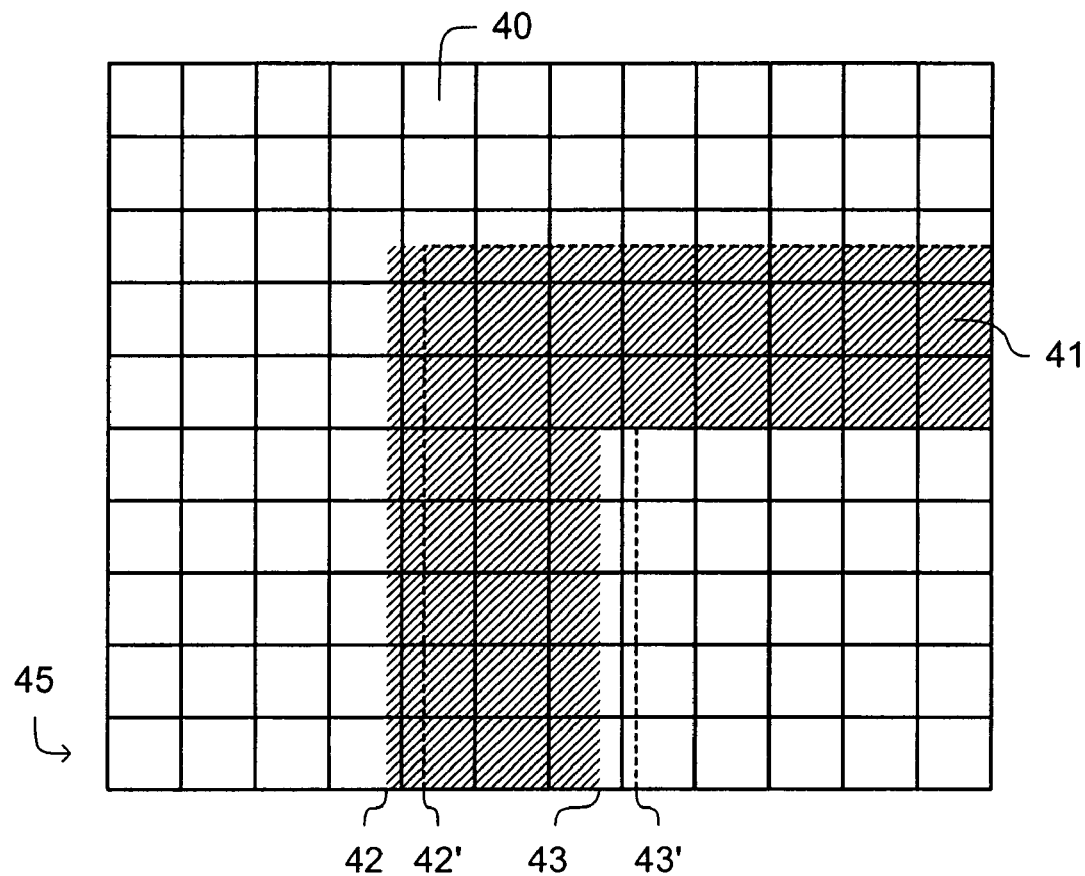
FIGS. 7a and 7b depict various aspects of an adjustment of a position of a feature on a substrate, according to one embodiment of the present invention.
Figure 7B:
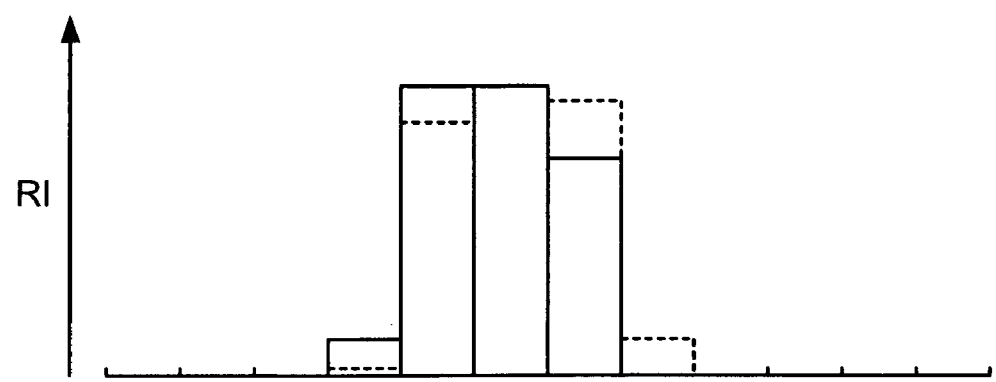

FIGS. 7a and 7b depict various aspects of an adjustment of a position of a feature on a substrate, according to one embodiment of the present invention. FIG. 7a depicts the layout of a plurality of points 40 on a substrate, corresponding to exposures controlled by single individually controllable elements. Also shown is a shaded region 41 corresponding to a feature that it is desired to generate. As shown, the boundaries of the feature are not aligned with the boundaries of the points 40 on the substrate, corresponding to exposures controlled by single individually controllable elements. FIG. 7b depicts the radiation intensity settings required for the points on the substrate, corresponding to exposures controlled by single individually controllable elements of one row 45 of points shown in FIG. 7a. The unbroken lines in FIG. 7b show the radiation intensity settings for the feature 41 shown in its position denoted by the shaded area in FIG. 7a. As shown, the points on the substrate, corresponding to exposures controlled by single individually controllable elements at the boundaries 42,43 of the feature are set to intermediate intensity levels.

As described above in relation to FIGS. 6a, 6b and 6c, in one example the position of the boundaries of a feature can be moved. In the embodiment shown in FIGS. 7a and 7b, by adjusting both the boundaries of a feature, the overall position of the feature can be adjusted. The broken lines in FIG. 7a show a modified position of feature 41 that can be required. As shown in FIG. 7b, in order to achieve this position shift, it is merely necessary to adjust the radiation intensity settings for the points on the substrate, corresponding to exposures controlled by single individually controllable elements, which are located at the feature boundaries. The broken lines in FIG. 7b show the adjusted intensity settings, resulting in the lateral movement of feature 41 such that it has boundaries 42' and 43'.

Figure 8A:
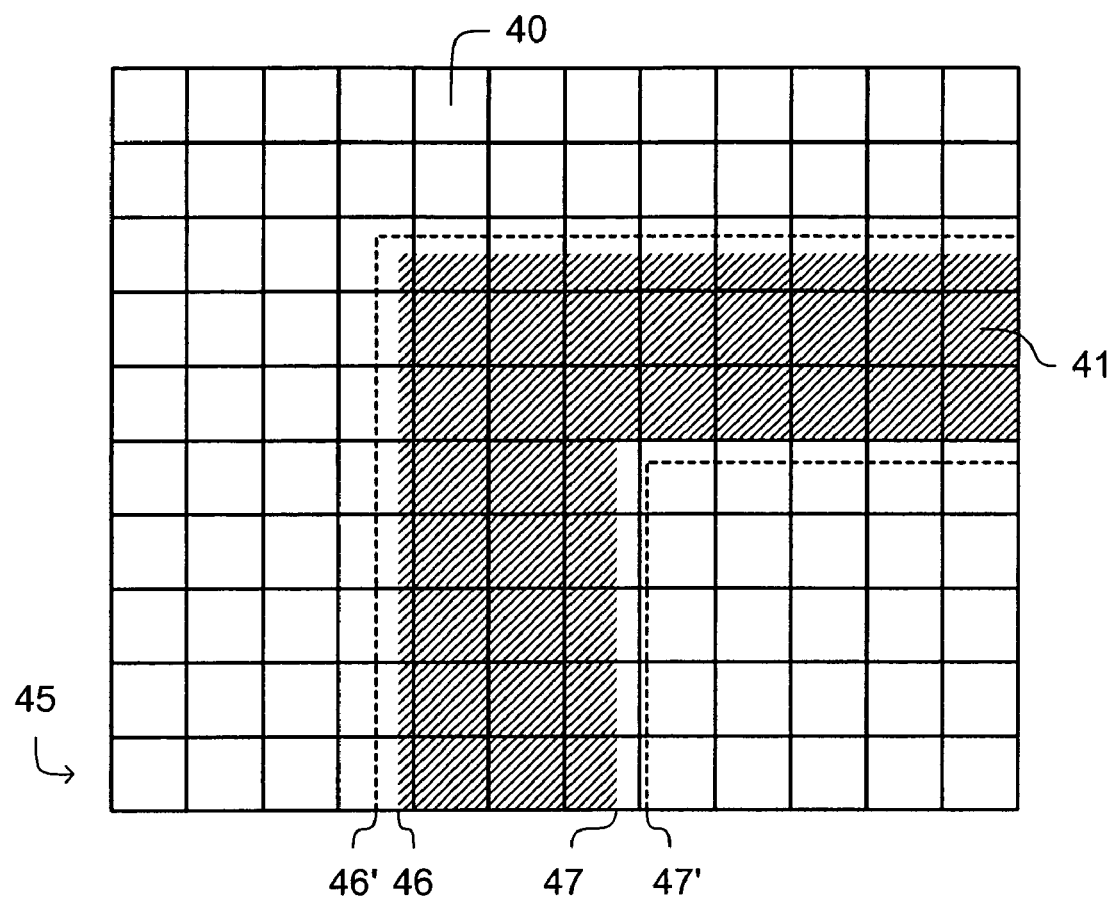
FIGS. 8a and 8b depict various aspects of an adjustment of a size of a feature formed on a substrate, according to one embodiment of the present invention.
Figure 8B:
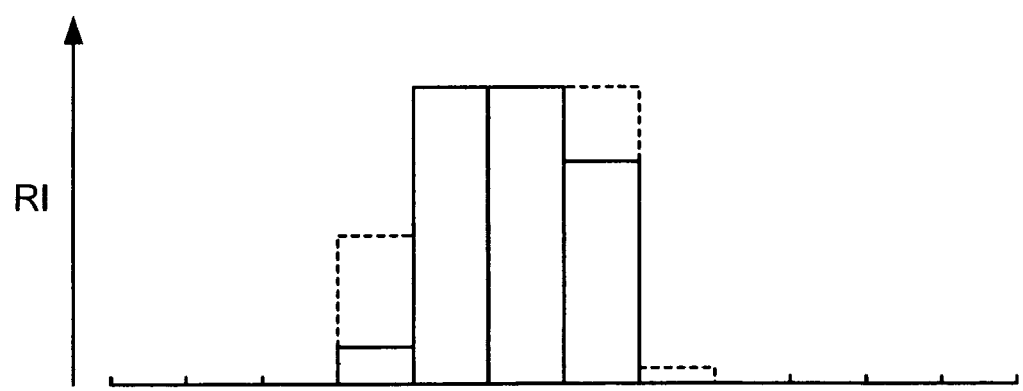

FIGS. 8a and 8b depict various aspects of an adjustment of a size of a feature formed on a substrate, according to one embodiment of the present invention. FIGS. 8a and 8b are similar to FIGS. 7a and 7b, and depict how the size of feature 41 formed on the substrate can be adjusted. This corresponds to adjusting the magnification of the image exposed on the substrates. In this example, the intensity settings are adjusted for the points on the substrate, corresponding to exposures controlled by single individually controllable elements located at the boundaries 46,47 of feature 41. In this case, the intensity settings at the boundaries 46,47 of the feature 41 are increased, resulting in new boundaries 46' and 47'.

In one example, in order to move the position of a boundary towards the center feature itself (e.g., towards the region of high radiation intensity for the examples discussed above), a reduction in the intensity settings for the points on the substrate that are located along the boundary of the feature, corresponding to exposures controlled by single individually controllable elements, is performed. In another example, in order to move the position of a boundary of a feature away from the feature itself (e.g., towards the region of relatively low radiation intensity for the examples discussed above), an increase on the radiation intensity settings for the points on the substrate that are located at the boundaries of the feature, corresponding to exposures controlled by single individually controllable elements, is performed. By adjusting the position of the boundaries of the features, it is possible to adjust the overall position of the features and/or their size, e.g., the magnification of image.

In one example, all of the adjustment of the position and magnification of the image generated on the substrate is performed electronically. For example, adjustments are made within the datapath that converts the pattern data, describing the pattern to be formed, into the control signals that control the array of individually controllable elements. This means that there are substantially no costly mechanical or opto-mechanical components, reducing the cost of the apparatus. It also reduces the requirement to calibrate the apparatus and the required maintenance of the apparatus. Furthermore, because in this example the adjustments can be performed electronically, it is possible to provide separate adjustments of both the position and magnification of the image at different portions of the image field. It is even possible to adjust the position and/or magnification of individual features or parts of individual features of the pattern entirely separately. This can be beneficial as it is therefore possible to compensate, for example, for distortions that can be introduced into the pattern of radiation projected onto the substrate by the projection system. Consequently, it becomes possible to achieve an improved overlay accuracy of the pattern on the substrate for each area on the substrate independently. Furthermore, it can be possible to locally adjust the magnification of pattern features without adjusting their position. It therefore becomes possible to adjust the size of the critical dimension of features independently for each area on the substrate. Accordingly, the critical dimension uniformity (commonly referred to as "CDU") for the device formed can be improved.

Figure 9:
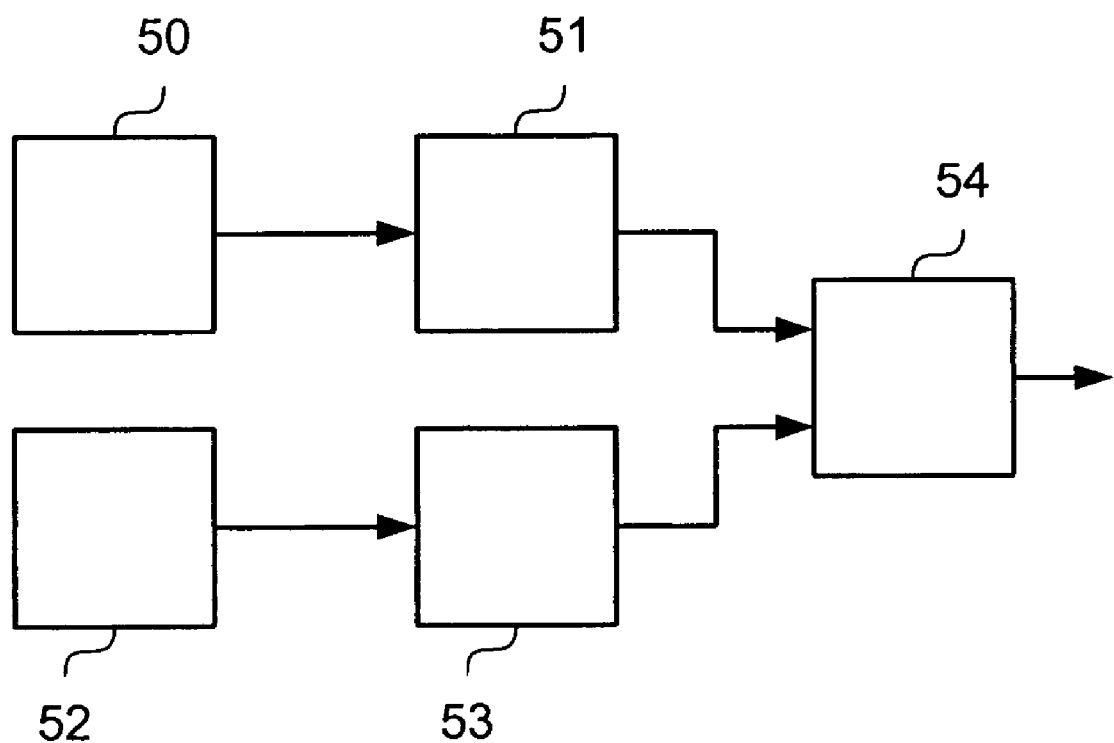
FIG. 9 depicts a control system for a lithographic apparatus, according to one embodiment of the present invention.

FIG. 9 depicts a control system for a lithographic apparatus, according to one embodiment of the present invention. A nominal radiation intensity controller 51 determines the nominal intensity required to be generated at each point on the substrate from pattern data 50 representing the pattern to be generated on substrate, which corresponds to exposures controlled by single individually controllable elements. Data 52, representing the required adjustments of the position and/or magnification of the pattern to be generated on the substrate, is analyzed by a boundaries analyzer 53 that determines the required adjustments of each of the features or parts of the features of the pattern and the consequent required adjustments of the feature boundaries. In one example, the data 52 can include data corresponding to inherent inaccuracies within the lithographic apparatus (e.g., to compensate for magnification errors or other distortions within the projection system), errors in the substrate table alignment, data representing deformations in the substrate, and/or data representing the alignment of previous features formed on the substrate relative to the substrate. In other examples, the data 52 can include global data, e.g., data that applies to all areas of the substrate or exposure field, and/or can include local data, namely data that is specific to a given area. A pattern adjustment controller 54 subsequently adjusts the intensity settings determined in the nominal radiation intensity controller 51 in order to adjust the position of the boundaries of the features as determined in boundaries analyzer 53. The pattern adjustment controller can also perform other adjustments to the intensity settings, for example, to compensate for variations between spots if pixel grid imaging is being used.

The adjustment of the intensity settings for the points on the substrate corresponding to exposures controlled by single individually controllable elements to produce the desired adjustment of the position of the feature boundary can be determined according to the following equation:

$$p1' = p1 + 0.5 * d2 * (p0 + p2 - 2*p1) + 0.5 * d * (p2 - p0)$$

where:

p1 is the nominal intensity of the portion of the modulated beam associated with the individually controllable element being set;

p1' is the intensity of the portion of the modulated beam associated with the individually controllable element necessary to be set to include the adjustment of the position of the boundaries of the features;

d is the size of the local shift of the boundary of the feature as a proportion of the separation of the portions of the modulated beam associated with adjacent individually controllable elements;

p0 is the nominal intensity of the modulated beam associated with the individually controllable element adjacent to the individually controllable element being set in the direction of the shift of the boundary feature; and p2 is the nominal intensity of the modulated beam associated with the individually controllable element adjacent the individually controllable element being set in a direction opposite that of the shift of the boundary feature.

It will be appreciated that the equation above is merely exemplary, and the present invention is not limited to use of this equation. For example, any form of quadratic interpolation or use of weighted averages can be used in order to determine the intensity setting changes required to adjust the position of the boundary of the feature.

In other examples, a simple form of interpolation, such as bilinear interpolation can be used. Such interpolation techniques, although simpler to perform, can introduce errors. However, this may not be a significant limitation in a one embodiment in which the control system calculates corrections to the pattern at a resolution finer than that of the pattern can be generated using the array of individually controllable elements. For instance, the control system can determine the required radiation intensity levels to generate a desired pattern for a plurality of virtual points on the substrate. In order to provide the increased resolution, the number of virtual points in a given region of the pattern is greater than the number of the individually controllable elements used to generate that region of the pattern. Once the radiation intensity levels for the virtual points have been determined, the pattern controller determines the radiation intensity levels in each part of the radiation beam corresponding to an individually controllable element based on the required radiation intensity levels for the plurality of virtual points corresponding to that part of the radiation beam. For example, the required radiation intensity level for a part of the radiation beam corresponding to an individually controllable element can be the average of the radiation intensity levels determined for the virtual points corresponding to that part of the radiation beam.

In one example, the modifications to the pattern to be printed, such as changing the magnification and/or position of a part of the pattern, are made while the pattern is defined by the virtual points. Accordingly, small errors that can be introduced by the use of a simplified interpolation technique are averaged out when the required radiation intensity levels are determined for each individually controllable element. In general, the greater the resolution of the virtual points, the greater the improvements in the accuracy of the pattern generated. In one example, a control system has a resolution of the virtual points about twice that of the individually controllable elements. Therefore, four virtual points, in a 2×2 array, are used to determine the required radiation intensity of the part of the radiation beam that corresponds to each individually controllable element.

The calculations for the determination of the modified intensity settings necessary to adjust the position of the boundaries of the features can be performed, for example, by means of one or more look-up tables.

As described above, the boundaries of pattern features may not be aligned with the edges of the points on the substrate, corresponding to exposures controlled by single individually controllable elements (see, for example, FIGS. 7*a* and 8*a*).

FIGS. 10*a* to 10*l* depict characters of a control system, according to an embodiment of the present invention. FIGS. 10*a* to 10*l* depict examples of portions of pattern features that can overlie a single point on a substrate that corresponds to an exposure controlled by a single individually controllable element. These are portions of the pattern that are the same size as the exposure on the substrate controlled by a single individually controllable element. Hereafter these will be referred to as pattern characters.

Although the position of a boundary of a pattern feature may not be limited to be aligned with the edge of points on a substrate that correspond to exposures controlled by single individually controllable elements, the patterns that can be formed on the substrate can be limited in that the minimum size of a feature, e.g., the distance between opposite boundaries, may not be below a given size. This size is commonly referred to as the critical dimension or CD. In practice, the critical dimension can be larger than the size of a point on the substrate that corresponds to an exposure controlled by a single individually controllable element. Consequently, a portion of the pattern of the size of a point on the substrate, corresponding to an exposure controlled by a single individually controllable element, may not include two opposite boundaries of a feature. In example, if the allowable orientations of the feature boundaries and the number of possible positions of the feature boundary within the area for each orientation are limited, the number of possible arrangements of a feature boundary within the area, e.g., the number of pattern characters required, becomes relatively small.

Figure 10A:
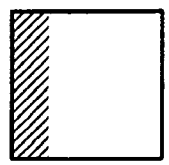
FIGS. 10a to 10l depict characters of a control system, according to an embodiment of the present invention.
Figure 10B:
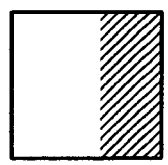
Figure 10C:
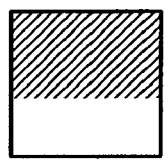
Figure 10D:
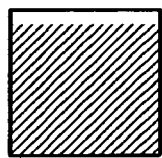
Figure 10E:
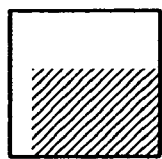
Figure 10F:
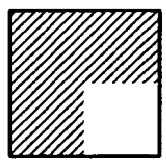
Figure 10G:
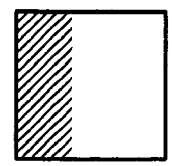
Figure 10H:
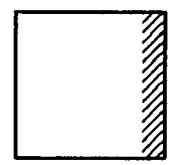
Figure 10I:
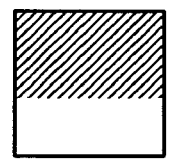
Figure 10J:
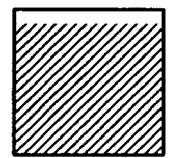
Figure 10K:
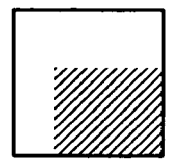
Figure 10L:
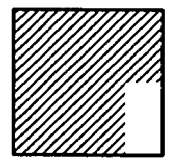

FIGS. 10*a* to 10*f* depict various examples of pattern characters. As shown, in FIG. 10*a* there is a vertical (relative to the page) boundary with the pattern feature located on the left hand side. FIG. 10b depicts a corresponding pattern character with the pattern feature located on the right hand side. FIGS. 10c and 10d depict corresponding complimentary pattern characters for pattern boundaries arranged horizontally relative to the page. FIG. 10e depicts a pattern character in which a corner between two pattern feature boundaries is located in a corner of the area, corresponding to an exposure controlled by a single individually controllable element. It will be appreciated that pattern characters can also exist for corners of pattern features arranged at any one of the four corners of the pattern character. FIG. 10f depicts the inverse of the pattern character of FIG. 10e, namely a pattern character in which only a corner of the pattern character is not part of a pattern feature. Again it will be appreciated that such pattern characters will exist with corresponding arrangements for all four of the corners of the pattern character.

The pattern characters shown in FIGS. 10a to 10f all depict pattern characters that can be used if the boundaries of the pattern features are vertical or horizontal (relative to the page). Additional pattern characters can be required if the system is to handle pattern features with boundaries at, for example, 45°. The greater the number of pattern characters that can be used, the greater the cost of the control system, but the greater the freedom provided to the pattern designer and/or the accuracy of the representation of the pattern.

In addition to the pattern characters shown in FIGS. 10a to 10f, there also exist corresponding pattern characters in which the pattern boundaries shown in the pattern characters of 10a to 10f are moved horizontally and/or vertically (relative to the page) in as many steps as are required to define the pattern as accurately as desired.

FIGS. 10g to 10l, for example, show pattern characters complimentary to those of FIGS. 10a to 10f in which the pattern boundaries have been shifted horizontally relative to the page. It will be apparent that where a shift of the pattern boundary in a particular direction does not change the pattern character, for example a movement parallel to the pattern feature boundary, no additional pattern character is required. Accordingly, FIG. 10c shows the same pattern character as 10i and FIG. 10d shows the same pattern character as FIG. 10j because in both cases the pattern feature boundary is parallel to the direction of the movement.

Each of the pattern characters can be associated with a particular intensity setting necessary for a point on the substrate, corresponding to an exposure controlled by a single individually controllable element. Accordingly, a control system for a lithographic apparatus in which the patterns generated can be defined by pattern characters can determine, for each point on the substrate to be exposed, to which pattern character the relevant portion of the pattern to be exposed corresponds. The corresponding individually controllable element can then be set to provide the intensity level that corresponds to that pattern character. This can be performed by means of a look-up table.

In order to adjust the position of the boundary of a feature, the control system for a lithographic apparatus employing such pattern characters can first determine a new pattern character for each point to be exposed, based on a nominal pattern character determined as above without consideration of the shift of the feature boundary and the size of the required shift of the feature boundary. For example, the pattern character shown in 10a would become the pattern character shown in 10g for a given lateral shift of the feature boundary. This transfer can be achieved by way of a look-up table for each pattern character for each possible shift of the boundary feature. The control system subsequently looks up the intensity setting necessary for the individually controllable element based on the modified pattern character. It will be appreciated that in order to determine the new pattern character it can be necessary to consider not only the pattern character of interest, but also the adjacent pattern character because, for example, a movement of a horizontal feature boundary can result in a pattern character including a corner of a pattern feature.

As an alternative to the control system described above, the control system can simply determine the nominal pattern character for each point to be exposed based on the unmodified pattern and use a look-up table that provides the required intensity setting for each pattern character for each possible required shift of the pattern feature boundary. This eliminates the need to determine a modified pattern character based on the shift of the pattern feature boundary but increases the complexity of the look-up table.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
an illumination system that conditions a radiation beam;
an array of individually controllable elements that modulate the radiation beam;
a projection system that projects the modulated beam onto a target portion of a substrate; and
a pattern controller that provides control signals to the array of individually controllable elements, wherein the pattern controller comprises a pattern adjuster, wherein the pattern adjuster adjusts the radiation intensity of the portion of the modulated beam at a boundary between regions in a desired pattern of relatively high radiation intensity and adjacent regions of relatively low radiation intensity in order to adjust the position of the boundary.

2. A lithographic apparatus, comprising:
an illumination system that conditions a radiation beam;
an array of individually controllable elements that modulate the radiation beam;
a projection system that projects the modulated beam onto a target portion of a substrate; and
a pattern controller that provides control signals to the array of individually controllable elements, wherein the pattern controller comprises a pattern adjuster, wherein the pattern adjuster determines a required adjustment of the position of boundaries of features of the desired pattern that are defined by regions of relatively high required radiation intensity in order to produce the required adjustment of at least one of size and position of the at least part of the pattern generated on the substrate, such that, when the boundary is moved towards the region of relatively low required radiation intensity, the pattern adjuster increases the intensity of the modulated beam at the boundary; and when the boundary is moved towards the region of relatively high required radiation intensity, the pattern adjuster decreases the intensity of the modulated beam at the boundary.

3. A lithographic apparatus, comprising:
an illumination system that conditions a radiation beam;
an array of individually controllable elements that modulate the radiation beam;
a projection system that projects the modulated beam onto a target portion of a substrate; and
a pattern controller that provides control signals to the array of individually controllable elements, wherein the pattern controller comprises a pattern adjuster, and wherein the pattern controller determines a radiation intensity for a plurality of virtual points on the substrate that collectively generate the desired pattern;
a number of the virtual points in a given region of the pattern is greater than a number of individually controllable elements used to generate the region of the pattern; and
the pattern controller determines radiation intensity in the part of the radiation beam corresponding to each of the individually controllable elements based on the radiation intensity for a plurality of the virtual points.

4. The lithographic apparatus of claim 3, wherein four of the virtual points are used to determine the radiation intensity of the part of the radiation beam corresponding to each of the individually controllable elements.

5. The lithographic apparatus of claim 3, wherein:
the pattern controller determines a nominal radiation intensity of the portion of the modulated beam associated with each of the virtual points to generate the desired pattern prior to adjusting at least one of the size and the position of the at least part of the pattern;
the pattern adjuster determines the adjustment of the position of the boundaries of features of the desired pattern that are defined by regions of relatively high required radiation intensity in order to produce the required adjustment of at least one of the size and the position of the at least part of the pattern generated on the substrate;
the pattern adjuster adjusts the pattern feature boundary through determining an adjusted radiation intensity for each of the virtual points using a bilinear interpolation of the nominal radiation intensity values for a plurality of the virtual points; and
the pattern adjuster uses the adjusted radiation intensity values for the virtual points to determine the radiation intensity for each part of the radiation beam corresponding to each of the individually controllable elements.

6. A lithographic apparatus, comprising:
an illumination system that conditions a radiation beam;
an array of individually controllable elements that modulate the radiation beam;
a projection system that projects the modulated beam onto a target portion of a substrate; and
a pattern controller that provides control signals to the array of individually controllable elements, wherein the pattern controller determines a nominal intensity of the portion of the modulated beam associated with each of the individually controllable elements to generate the desired pattern prior to adjusting at least one of the size and the position of the at least part of the pattern;
the pattern adjuster determines the required adjustment of the position of the boundaries of features of the desired pattern that are defined by regions of relatively high required radiation intensity in order to produce the adjustment of at least one of the size and the position of the at least part of the pattern generated on the substrate; and
the adjustment of the position of the pattern feature boundary is performed by setting each of the individually controllable elements, such that the intensity of the corresponding portion of the modulated beam is a weighted average of the nominal intensity for the individually controllable element and the nominal intensity of at least one other individually controllable element located, relative to the individually controllable elements being set, in a direction parallel to a direction of the adjustment of the boundary, wherein the weight of the average is determined by the size of the adjustment of the boundary that is required.

7. The lithographic apparatus of claim 6, wherein each individually controllable elements is set according to the equation:

$$p1'=p1+0.5*d2*(p0+p2-2*p1)+0.5*d*(p2-p0)$$

where:
$p1$ is the nominal intensity of the portion of the modulated beam associated with the individually controllable element being set;
$p1'$ is the intensity of the portion of the modulated beam associated with the individually controllable element necessary to be set to include the adjustment of the position of the boundaries of the features;
d is the size of a local shift of the boundary of the feature as a proportion of the separation of the portions of the modulated beam associated with adjacent individually controllable elements;
$p0$ is the nominal intensity of the modulated beam associated with the individually controllable element adjacent to the individually controllable element being set in the direction of the shift of the boundary feature; and
$p2$ is the nominal intensity of the modulated beam associated with the individually controllable element adjacent the individually controllable element being set in a direction opposite that of the shift of the boundary feature.

8. The lithographic apparatus of claim 7, wherein the pattern controller evaluates the equation in order to set the individually controllable elements as through use of one or more look-up tables.

9. A lithographic apparatus, comprising:
an illumination system that conditions a radiation beam;
an array of individually controllable elements that modulate the radiation beam;
a projection system that projects the modulated beam onto a target portion of a substrate; and a pattern controller that provides control signals to the array of individually controllable elements, wherein the pattern controller comprises a pattern adjuster, and wherein the pattern to be generated on the substrate is arranged such that the portion of the desired pattern associated with each individually controllable element is one of a plurality of pattern characters;

each of the pattern characters is associated with a corresponding intensity of the portion of the modulated beam of the individually controllable element; and the pattern controller sets each of the individually controllable elements to provide the intensity in each corresponding portion of the modulated beam according to the pattern character assigned to the individually controllable elements.

10. The lithographic apparatus of claim 9, wherein:

the pattern adjuster determines an adjustment of a position of boundaries of pattern features of the desired pattern that are defined by regions of relatively high radiation intensity in order to produce the adjustment of at least one of size and position of at least part of the pattern generated on substrate;

the pattern adjuster determines a corresponding position adjustment for the pattern characters associated with each of the individually controllable elements; and the pattern controller sets each of the individually controllable elements to provide a predetermined radiation intensity in the corresponding portion of the modulated beam for each of the pattern characters for a given position adjustment.

11. The lithographic apparatus of claim 10, wherein the pattern controller includes look up tables containing settings for each of the individually controllable elements for each possible one of the position adjustments for each of the pattern characters.

12. The lithographic apparatus of claim 10, wherein:

the pattern adjuster uses the position adjustment for each of the pattern characters to determine which pattern character is associated with each of the individually controllable elements after the position adjustment is made; and the pattern controller includes look up tables containing settings for each of the individually controllable elements for each of the pattern characters.

13. The lithographic apparatus of claim 8, wherein:

the pattern controller limits the pattern to be generated on the substrate such that, for each of the possible pattern characters at a given location, the pattern characters at each adjacent location is limited to a subset of all the pattern characters; and the pattern controller determines the settings for a plurality of adjacent individually controllable elements jointly.

14. The lithographic apparatus of claim 13, wherein a size of the pattern feature generated by the plurality of adjacent individually controllable elements jointly set by the pattern controller is a minimum feature size of the pattern to be generated.

* * * * *